United States Patent [19]

Fukuoka et al.

[11] Patent Number: 4,894,184

[45] Date of Patent: Jan. 16, 1990

[54] LOW-TEMPERATURE BURNT CONDUCTIVE PASTE AND METHOD OF MANUFACTURING PRINTED CIRCUIT BOARD

[75] Inventors: Shingoro Fukuoka, Tokyo; Kouichi Shintomi, Yokohama; Ryu Maeda, Tokyo; Kaisuke Shiroyama, Nikko, all of Japan

[73] Assignee: The Furukawa Electric Co., Ltd., Tokyo, Japan

[21] Appl. No.: 43,096

[22] Filed: Apr. 27, 1987

[30] Foreign Application Priority Data

Aug. 27, 1986 [JP]  Japan ................................ 61-200731

[51] Int. Cl.$^4$ .............................................. H01B 1/06
[52] U.S. Cl. ..................... 252/512; 252/518; 252/514
[58] Field of Search ................... 252/512, 518, 514; 501/19

[56] References Cited

U.S. PATENT DOCUMENTS

| | | | |
|---|---|---|---|
| 4,072,771 | 2/1978 | Grier | 252/518 |
| 4,305,847 | 12/1981 | Stoetzer et al. | 252/512 |
| 4,376,725 | 3/1983 | Prabhu | 252/512 |
| 4,400,214 | 8/1983 | Ogawa et al. | 252/512 |
| 4,446,059 | 5/1984 | Eustice | 252/518 |
| 4,517,155 | 5/1985 | Prakash et al. | 252/512 |
| 4,623,482 | 11/1986 | Kuo et al. | 252/512 |
| 4,687,597 | 8/1987 | Siuta | 252/518 |

FOREIGN PATENT DOCUMENTS

| | | |
|---|---|---|
| 57-55005 | 4/1982 | Japan . |
| 58-10302 | 1/1983 | Japan . |
| 58-71507 | 4/1983 | Japan . |
| 61-289691 | 12/1986 | Japan . |
| 61-292393 | 12/1986 | Japan . |
| 61-292394 | 12/1986 | Japan . |

*Primary Examiner*—Josephine Barr
*Attorney, Agent, or Firm*—Frishauf, Holtz, Goodman & Woodward

[57] ABSTRACT

A low-temperature burnt conductive paste prepared by dispersing, in an organic vehicle, a base material comprising 50 to 95% by weight of a powder of at least one conductive material selected from the group consisting of a copper alloy, a copper oxide and a copper alloy oxide and 5 to 50% by weight of a glass powder having a softening point of 300° to 600° C. and a coefficient of thermal expansion of 6 to $13 \times 10^{-6}$°C.$^{-1}$, and a method of manufacturing a printed circuit board using this paste.

13 Claims, No Drawings

LOW-TEMPERATURE BURNT CONDUCTIVE PASTE AND METHOD OF MANUFACTURING PRINTED CIRCUIT BOARD

BACKGROUND OF THE INVENTION

The present invention relates to a burnt conductive paste used for a printed circuit board for an internal wiring material of electronic equipment and the like and a method of manufacturing a printed circuit board using the same.

A conventional conductive paste of this type consists of a metal powder, a glass frit, and an organic vehicle. As the metal powder, metals such as Au, Ag, Ag-Pd, Cu, and the like are used. These conductive pastes are printed on insulating boards and burnt at a temperature of about 900° C. to form thick films. The resultant structures are used as conductor circuits having a specific resistance of about $5 \times 10^{-5}$ $\Omega$·cm or less.

As the insulating boards used for these conductive pastes, ceramic boards, in particular, alumina boards, which do not change at the burning temperature, which have a sufficient adhesive strength with the conductive pastes, and which have good electrical insulating properties, are used.

Since Au, Ag, and Pd are expensive, Cu paste has recently received a great deal of attention. Copper (Cu) is inexpensive and has good characteristics, in that it has a good electrical conductivity and soldering properties, and it does not easily cause migration, and so on.

However, since copper is easily oxidized, it cannot be burnt in air, and must be burnt in a nitrogen atmosphere having a specific oxygen partial pressure in which an organic vehicle can be evaporated and copper is not oxidized, resulting in cumbersome operations. For this reason, a current Cu paste is expensive.

Recently, a conductive paste using copper oxide has been proposed. In this paste, a small amount of a Pt powder, a Pd powder, Ni powder, or a manganese oxide powder is added to a copper oxide powder, the resultant mixture is burnt at a temperature of about 700° C. in air and is then reduced in a reducing atmosphere at a temperature of about 1,000° C., thereby preparing a conductor. In this method, strict atmospheric control is not necessary. However, burning at this temperature aims at the same applications and effects as those of the Cu paste, and the resultant paste is assumed to be applied to a ceramic board such as an alumina board, as the board material. However, since the conductive pastes use expensive noble metals, they are still expensive (Japanese Patent Disclosure (Kokai) Nos. 61-289691, 61-292394, and 61-292393).

Recently, another conductive paste which can be burnt at a temperature of about 500° to 675° C. has been proposed. The conductive paste consists of a metal powder such as a powder of Ag, Cu, Ag alloy, Cu alloy, or the like, a glass frit, and an organic vehicle. The mixture is burnt while an amount of the glass frit is increased in order to improve the adhesive strength to the board and the mechanical strength of the resultant thick film (Japanese Patent Disclosure (Kokai) Nos. 58-71507 and 58-10302).

In addition, still another conductive paste containing a copper oxide powder as a base material is proposed. In this paste, 7 to 27% by weight of boron, 0 to 35% by weight of a glass frit, and the balance of the copper oxide powder are dissolved in the organic vehicle, and the resultant paste is heated in air at a temperature of 500° to 675° C. to prepare a thick film conductor (Japanese Patent Disclosure (Kokai) No. 57-55005).

However, the resultant conductive film obtained by heating the conductive paste in air has an unsatisfactory conductivity of 10 $\Omega/\square$ or lower and poor soldering properties. Therefore, this paste cannot be used for a printed circuit board.

As described above, since the conventional copper oxide based conductive pastes aim at only decreasing a burning temperature of the paste in view of energy cost, the pastes having a low conductivity can only be obtained.

SUMMARY OF THE INVENTION

In consideration of the above situation, the present inventors have made extensive studies, and as a result, developed a conductive paste which can be burnt at a low temperature of 300° to 600° C., and with which a resultant conductor circuit can have a sufficient adhesive strength with an insulating board and a circuit having a high conductivity and good soldering properties can be formed.

More specifically, the present invention relates to a low-temperature burnt conductive paste prepared by dispersing, in an organic vehicle, a base material comprising 50 to 95% by weight of a powder of at least one conductive material selected from the group consisting of copper, a copper alloy containing copper as a major component, and oxides thereof, and 5 to 50% by weight of a glass powder having a softening point of 300° to 600° C. and a coefficient of thermal expansion of 6 to $13 \times 10^{-6}$ °C.$^{-1}$, and to a method of manufacturing a printed circuit board comprising forming a circuit pattern on an insulating inorganic board by a desired process using the conductive paste, heating the resultant structure in air at a temperature of 300° to 600° C., and then heating the structure in a reducing atmosphere at a temperature of 400° to 600° C.

DETAILED DESCRIPTION OF THE PREFERRED EMBODIMENTS

A conventional copper based conductive paste is burnt in a non-oxidizing atmosphere so as not to oxidize copper. However, in contrast to this, a conductive paste of the present invention can be burnt at low temperatures by oxidizing copper.

In general, since an oxide film is provided on the surface of a metal powder particle, a burning temperature cannot be decreased. For this reason, a burning process is normally performed in a reducing atmosphere. However, if an organic vehicle is contained in a conductive paste, the burning process cannot be performed in a reducing atmosphere to evaporate the organic vehicle.

In the conductive paste of the present invention, the first burning process is performed in air to evaporate the organic vehicle and to improve wetting properties between the copper oxide and glass, thereby improving the mechanical strength of a resultant conductive film. During the second burning process in the reducing atmosphere, copper oxide is reduced and at the same time, sintering is accelerated, that is, activated sintering is performed, thereby forming a conductive film having a good electrical conductivity. In the conductive paste of the present invention, a copper powder, a copper alloy powder, and an oxide powder thereof are not sufficient to allow the burning process at a low temperature, and they are combined with glass having a low softening point, thereby obtaining a conductive paste having satisfactory characteristics.

Since the conductive paste of the present invention aims at burning at a low temperature, if it is burnt at a high temperature, satisfactory characteristics cannot be obtained. More specifically, if the burning process is performed in air at a temperature of 650° C. or higher, $Cu_2O$ reacts with an oxide such as PbO as a component of glass, and a composite oxide is formed. As a result, a desired copper cannot be obtained in the burning process in the reducing atmosphere.

Particles of copper alloy, copper, and/or an oxide thereof are flattened to increase the specific surface area of the particles, to increase the area of contact with the board, and to increase the area of contact with a glass phase. Therefore, a high adhesive strength can be obtained. When the specific surface area is large, a probability of contact of powder particles is increased, and conductivity can also be improved.

If an oxide powder of a copper alloy containing silver, tin, and the like is used, soldering properties can be improved.

In the conductive paste of the present invention, the reason why a content of a glass powder having a softening point of 300° to 600° C. and a coefficient of thermal expansion of 6 to $13 \times 10^{-6}$° $C.^{-1}$ is limited to 5 to 50% by weight is as follows. If the content is lower than 5% by weight, the resultant paste is poor in adhesion to the insulating board. If the content exceeds 50% by weight, soldering properties to a circuit board prepared by using the paste of the present invention are considerably degraded.

Low softening-point glasses having a softening point of 300° to 600° C. and a coefficient of thermal expansion of 6 to $13 \times 10^{-6}$° $C.^{-1}$ include $PbO-B_2O_3-SiO_2$ based glass, $ZnO-B_2O_3-PbO$ based glass, and the like. A small amount of an oxide such as BaO, $Al_2O_3$, $TiO_2$, $ZrO_2$, ZnO, or the like can be contained in these glasses. The glass powder preferably has a size smaller than 325 mesh.

A conductive material powder preferably has a particle size of 10 μm or smaller, and a flattening ratio of 1.5 or higher in terms of the conductivity of the resultant paste and an adhesive strength to the insulating board.

When an oxide of copper or a copper alloy is used as a conductive material, one having an oxidation ratio of 0.1 to 100% is preferable. The oxidation ratio represents an oxygen content in percentage by weight when $Cu_2O$ is 100% and Cu is 0%. As a copper alloy containing copper as a major component, one selected from the group consisting of Cu-Ag, Cu-Sn, and Cu-Ag-Sn, and having an Ag content of 0.05 to 50% by weight and an Sn content of 0.01 to 10% by weight, is preferable.

As an organic vehicle, one prepared by dissolving about 10% by weight of a material such as ethyl cellulose, saturated fatty acid-modified alkyd resin, or the like in butyl carbitol or turpentine oil can be used. A mixing ratio of the base material and the organic vehicle can be determined in association with a viscosity of the resultant paste.

The conductive paste of the present invention is printed on a ceramic board, a porcelain enamel board, or the like by screen printing. After drying, the board is heated in air at a temperature of 300° to 600° C., and thereafter, is heated in the reducing atmosphere at a temperature of 400° to 600° C., thereby preparing a conductor circuit.

The present invention will be described hereinafter by way of its examples.

EXAMPLE 1

A copper oxide powder having an average particle size of 0.6 μm and a $PbO-SiO_2-B_2O_3$ based glass powder having a softening point of about 400° C. and a coefficient of thermal expansion of $8.5 \times 10^{-6}$° $C.^{-1}$ (glass composition: 4.5% of $SiO_2$, 70% of PbO, 15.5% of $B_2O_3$, 8% of ZnO, and 2% of $Al_2O_3$) were mixed at various mixing ratios to prepare base materials. These base materials were dispersed in an organic vehicle prepared such that 10% by weight of ethyl cellulose was dissolved in butyl carbitol, thereby preparing conductive pastes. The conductive pastes were screen-printed on alumina boards, and were respectively burnt at temperatures shown in Table 1. The specific resistance, the adhesive strength, and the soldering properties of the resultant conductors were tested. The test results are shown in Table 1.

TABLE 1

| No. | Glass Content (wt. %) | Copper Oxide Content (wt. %) | Oxidation Ratio (%) | Burning Temperature (°C.) In Air | Burning Temperature (°C.) In Hydrogen Atmosphere | Specific Resistance (Ω · cm) | Adhesive Strength (kg/mm²) | Soldering Property | Total Evaluation |
|---|---|---|---|---|---|---|---|---|---|
| 1 | 0 | 100 | 90 | 500 | 500 | $1 \times 10^{-3}$ | 0 | Δ | x |
| 2 | 5 | 95 | 90 | 500 | 500 | $1 \times 10^{-5}$ | 0.3 | Δ | ○ |
| 3 | 10 | 90 | 90 | 500 | 500 | $8 \times 10^{-6}$ | 0.5 | ○ | ○ |
| 4 | 20 | 80 | 90 | 500 | 500 | $3 \times 10^{-6}$ | 0.9 | ◎ | ◎ |
| 5 | 30 | 70 | 90 | 500 | 500 | $8 \times 10^{-6}$ | 1.5 | ◎ | ◎ |
| 6 | 40 | 60 | 90 | 500 | 500 | $1 \times 10^{-5}$ | 1.5 | ○ | ○ |
| 7 | 50 | 50 | 90 | 500 | 500 | $2.5 \times 10^{-5}$ | 1.5 | Δ | ○ |
| 8 | 60 | 40 | 90 | 500 | 500 | $7 \times 10^{-5}$ | 1.5 | x | x |

(Note) ◎ ... Excellent ○ ... Good Δ ... Fair x ... Poor

EXAMPLE 2

Following the same procedure as in Example 1, the conductive paste of sample No. 5 prepared in Example 1 was burnt at various burning temperatures, and resultant characteristics were tested. The test results are shown in Table 2.

TABLE 2

| No. | Glass Content (wt. %) | Copper Oxide Content (wt. %) | Oxidation Ratio (%) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- | --- |
| 9  | 30 | 70 | 90 | 300 | 500 | $9 \times 10^{-6}$ | 1.4 | ◉ | ◉ |
| 10 | 30 | 70 | 90 | 300 | 300 | $7 \times 10^{-3}$ | 0.8 | ○ | x |
| 11 | 30 | 70 | 90 | 400 | 400 | $1.5 \times 10^{-5}$ | 1.1 | ◉ | ◉ |
| 12 | 30 | 70 | 90 | 500 | 300 | $3 \times 10^{-3}$ | 1.1 | ○ | x |
| 13 | 30 | 70 | 90 | 600 | 600 | $7 \times 10^{-6}$ | 1.5 | ◉ | ◉ |
| 14 | 30 | 70 | 90 | 700 | 300 | $1 \times 10^{-2}$ | 1.0 | x | x |
| 15 | 30 | 70 | 90 | 700 | 400 | $5 \times 10^{-3}$ | 1.1 | x | x |
| 16 | 30 | 70 | 90 | 700 | 500 | $1 \times 10^{-3}$ | 1.2 | Δ | x |

As can be seen from Table 2, when the burning temperature falls within the range of 300° C. to 600° C. in air and within the range of 400° C. to 600° C. in a hydrogen atmosphere, the best characteristics can be obtained.

EXAMPLE 3

The influence of the oxidation ratio of copper oxide was tested. Conductive pastes and conductors were prepared using compositions and burning temperatures shown in Table 3 following the same procedures as in Example 1, and Table 3 shows the characteristics of the resultant conductors.

TABLE 3

| No. | Glass Content (wt. %) | Copper Oxide Content (wt. %) | Oxidation Ratio (%) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- | --- |
| 17 | 30 | 70 | 1   | 500 | 500 | $1 \times 10^{-5}$ | 1.4 | ◉ | ◉ |
| 18 | 30 | 70 | 50  | 500 | 500 | $8 \times 10^{-6}$ | 1.5 | ◉ | ◉ |
| 19 | 30 | 70 | 100 | 500 | 500 | $8 \times 10^{-6}$ | 1.5 | ◉ | ◉ |

As can be seen from Table 3, as the oxidation ratio of copper is increased, better characteristics can be obtained.

EXAMPLE 4

The influence of a flattening ratio (a ratio of length/thickness) of the copper oxide powder was tested. Following the same procedures as in Example 1, conductive pastes and conductors were prepared using compositions, types, and burning temperatures shown in Table 4. The characteristics of the resultant conductors are shown in Table 4.

TABLE 4

| No. | Glass Content (wt. %) | Copper Oxide Content (wt. %) | Flattening Ratio (%) | Oxidation Ratio (%) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- | --- | --- |
| 20 | 30 | 70 | 1.1 | 90 | 500 | 500 | $5 \times 10^{-5}$ | 1.0 | ○ | ○ |
| 21 | 30 | 70 | 2   | 90 | 500 | 500 | $8 \times 10^{-6}$ | 1.9 | ◉ | ◉ |
| 22 | 30 | 70 | 8   | 90 | 500 | 500 | $7 \times 10^{-6}$ | 2.1 | ◉ | ◉ |
| 23 | 30 | 70 | 5   | 95 | 500 | 500 | $7.5 \times 10^{-6}$ | 1.7 | ◉ | ◉ |
| 24 | 30 | 70 | 5   | 10 | 500 | 500 | $8 \times 10^{-6}$ | 1.8 | ◉ | ◉ |
| 25 | 30 | 70 | 1.4 | 99 | 500 | 500 | $1.5 \times 10^{-5}$ | 1.1 | ○ | ○ |

(Note) A copper oxide powder having an average particle size of 2 μm used in sample Nos. 23 to 25.

As can be seen from Table 4, the copper oxide powder having a flattening ratio of 1.5 or higher had better characteristics.

EXAMPLE 5

Seventy percent by weight of various copper alloy oxide powders having an average particle size of 1 μm and 30% by weight of $PbO$-$SiO_2$-$B_2O_3$ based glass having a softening point of about 550° C. and a coefficient of thermal expansion of $7.8 \times 10^{-6}$ °C.$^{-1}$ (glass composition: 11% of $SiO_2$, 81% of $PbO$, 4% of $B_2O_3$, 3% of $Al_2O_3$, and 1% of $ZnO_2$) were mixed to prepare base materials. The base materials were dispersed in an organic vehicle in which 10% by weight of ethyl cellulose was dissolved in butyl carbitol, thereby preparing conductive pastes. The conductive pastes were screen-printed on alumina boards, and were burnt at predetermined temperatures. The specific resistance, the adhesive strength, and the soldering properties of the resultant conductors were tested. The test results are shown in Table 5.

TABLE 5

| No. | Alloy Composition | Oxidation Ratio (%) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- |
| 26 | Cu—1% Ag | 90 | 600 | 500 | $8 \times 10^{-6}$ | 1.5 | ◎ + | ◎ |
| 27 | Cu—10% Ag | 90 | 600 | 500 | $9 \times 10^{-6}$ | 1.5 | ◎ ++ | ◎ |
| 28 | Cu—50% Ag | 90 | 600 | 500 | $1 \times 10^{-5}$ | 1.5 | ◎ ++ | ◎ |
| 29 | Cu—1% Sn | 90 | 600 | 500 | $1 \times 10^{-5}$ | 1.5 | ◎ + | ◎ |
| 30 | Cu—5% Sn | 90 | 600 | 500 | $2 \times 10^{-5}$ | 1.5 | ◎ ++ | ◎ |
| 31 | Cu—10% Sn | 90 | 600 | 500 | $5 \times 10^{-5}$ | 1.5 | ◎ ++ | ○ |
| 32 | Cu—20% Ag—5% Sn | 90 | 600 | 500 | $2 \times 10^{-5}$ | 1.4 | ◎ ++ | ◎ |
| 33 | Cu—0.03% Ag | 90 | 600 | 500 | $8 \times 10^{-6}$ | 1.5 | ◎ | ◎ |
| 34 | Cu—0.005% Sn | 90 | 600 | 500 | $8 \times 10^{-6}$ | 1.4 | ◎ | ◎ |
| 35 | Cu—60% Ag | 90 | 600 | 500 | $2 \times 10^{-6}$ | 1.6 | ◎ + | ◎ |
| 36 | Cu—15% Sn | 90 | 600 | 500 | $1 \times 10^{-4}$ | 1.3 | ◎ | x |

(Note) + indicates better and ++ indicates best of the excellent category.

EXAMPLE 6

A copper powder having an average particle size of 1 μm and a PbO-SiO$_2$-B$_2$O$_3$ based glass powder (the same composition as in Example 1) were mixed at various mixing ratios to prepare base materials. The base materials were dispersed in an organic vehicle in which 10% by weight of ethyl cellulose was dissolved in butyl carbitol, thereby preparing conductive pastes. The conductive pastes were screen-printed on alumina boards and were burnt at predetermined temperatures. The specific resistance, the adhesive strength, and the soldering properties of the resultant conductors were tested. The test results are shown in Table 6.

TABLE 6

| No. | Glass Content (wt. %) | Copper Content (wt. %) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- |
| 37 | 0 | 100 | 500 | 500 | $3 \times 10^{-3}$ | 0 | △ | x |
| 38 | 5 | 95 | 500 | 500 | $1.1 \times 10^{-5}$ | 0.3 | △ | ○ |
| 39 | 10 | 90 | 500 | 500 | $8.5 \times 10^{-6}$ | 0.5 | ○ | ○ |
| 40 | 20 | 80 | 500 | 500 | $8.6 \times 10^{-6}$ | 0.9 | ◎ | ◎ |
| 41 | 30 | 70 | 500 | 500 | $8.5 \times 10^{-6}$ | 1.5 | ◎ | ◎ |
| 42 | 40 | 60 | 500 | 500 | $1 \times 10^{-5}$ | 1.5 | ○ | ○ |
| 43 | 50 | 50 | 500 | 500 | $3 \times 10^{-5}$ | 1.5 | △ | ○ |
| 44 | 60 | 40 | 500 | 500 | $6 \times 10^{-5}$ | 1.5 | x | x |

EXAMPLE 7

The conductors were formed on the alumina boards using the conductive paste of sample No. 41 prepared in Example 6 while changing the burning temperature, and the characteristics of the resultant conductors were tested. The test results are shown in Table 7.

TABLE 7

| No. | Glass Content (wt. %) | Copper Content (wt. %) | Burning Temperature (°C.) In Air | Burning Temperature (°C.) In Hydrogen Atmosphere | Specific Resistance ($\Omega \cdot cm$) | Adhesive Strength ($kg/mm^2$) | Soldering Property | Total Evaluation |
| --- | --- | --- | --- | --- | --- | --- | --- | --- |
| 45 | 30 | 70 | 300 | 500 | $9 \times 10^{-6}$ | 1.3 | ◎ | ◎ |
| 46 | 30 | 70 | 300 | 300 | $7.3 \times 10^{-3}$ | 0.8 | ○ | x |
| 47 | 30 | 70 | 400 | 400 | $1.6 \times 10^{-5}$ | 1.1 | ◎ | ◎ |
| 48 | 30 | 70 | 500 | 300 | $3 \times 10^{-3}$ | 1.0 | ○ | x |
| 49 | 30 | 70 | 600 | 600 | $3 \times 10^{-6}$ | 1.5 | ◎ | ◎ |
| 50 | 30 | 70 | 700 | 300 | $2 \times 10^{-2}$ | 1.0 | x | x |
| 51 | 30 | 70 | 700 | 400 | $6 \times 10^{-3}$ | 1.1 | x | x |
| 52 | 30 | 70 | 700 | 500 | $1 \times 10^{-3}$ | 1.2 | △ | x |

As can be seen from Table 7, when the copper powder is used, if the burning temperature falls within the range of 300° C. to 600° C. in air and within the range of 400° C. to 600° C. in a hydrogen atmosphere, conductors having good characteristics can be obtained.

EXAMPLE 8

The influence of a flattening ratio (a ratio of length/thickness) of the copper powder on the characteristics of the conductor was tested. Following the same procedures as in Example 6, conductive pastes and conductors were prepared using compositions, types, and burning temperatures shown in Table 8. The characteristics of the resultant conductors are shown in Table 8.

TABLE 8

| No. | Glass Content (wt. %) | Copper Content (wt. %) | Flattening Ratio (%) | Burning Temperature (°C.) In Air | Burning Temperature (°C.) In Hydrogen Atmosphere | Specific Resistance (Ω·cm) | Adhesive Strength (kg/mm²) | Soldering Property | Total Evaluation |
|---|---|---|---|---|---|---|---|---|---|
| 53 | 30 | 70 | 1.1 | 500 | 500 | $5 \times 10^{-5}$ | 1.0 | ○ | ○ |
| 54 | 30 | 70 | 1.4 | 500 | 500 | $1.5 \times 10^{-5}$ | 1.1 | ○ | ○ |
| 55 | 30 | 70 | 2 | 500 | 500 | $8 \times 10^{-6}$ | 1.9 | ◎ | ◎ |
| 56 | 30 | 70 | 5 | 500 | 500 | $8 \times 10^{-6}$ | 1.7 | ◎ | ◎ |
| 57 | 30 | 70 | 5 | 500 | 500 | $9 \times 10^{-6}$ | 1.8 | ◎ | ◎ |
| 58 | 30 | 70 | 8 | 500 | 500 | $7.5 \times 10^{-6}$ | 2.1 | ◎ | ◎ |

As can be seen from Table 8, the copper powder having a flattening ratio of 1.5 or more can provide good characteristics.

EXAMPLE 9

Seventy percent by weight of copper alloy powders having compositions shown in Table 9 and an average particle size of 1 μm and 30% by weight of a PbO-SiO$_2$-B$_2$O$_3$ based glass powder having a softening point of about 350° C. and a coefficient of thermal expansion of $11 \times 10^{-6}$° C.$^{-1}$ (glass composition: 4% of SiO$_2$, 85% of PbO, 18% of B$_2$O$_3$, 1% of Al$_2$O$_3$, and 2% of ZnO) were mixed to prepare base materials. The base materials were dispersed in an organic vehicle in which 10% by weight of ethyl cellulose was dissolved in butyl carbitol, thereby preparing conductive pastes. The conductive pastes were screen-printed on alumina boards, and were burnt at temperatures shown in Table 9. The specific resistance, the adhesive strength, and the soldering properties of the resultant conductors were tested. The test results are shown in Table 9.

TABLE 9

| No. | Alloy Composition | Burning Temperature (°C.) In Air | Burning Temperature (°C.) In Hydrogen Atmosphere | Specific Resistance (Ω·cm) | Adhesive Strength (kg/mm²) | Soldering Property | Total Evaluation |
|---|---|---|---|---|---|---|---|
| 59 | Cu—1% Ag | 500 | 500 | $8 \times 10^{-6}$ | 1.5 | ◎ + | ◎ |
| 60 | Cu—10% Ag | 500 | 500 | $9 \times 10^{-6}$ | 1.5 | ◎++ | ◎ |
| 61 | Cu—50% Ag | 500 | 500 | $1 \times 10^{-5}$ | 1.5 | ◎++ | ◎ |
| 62 | Cu—1% Sn | 500 | 500 | $2 \times 10^{-5}$ | 1.5 | ◎ + | ◎ |
| 63 | Cu—5% Sn | 500 | 500 | $5 \times 10^{-5}$ | 1.5 | ◎++ | ○ |
| 64 | Cu—10% Sn | 500 | 500 | $7 \times 10^{-5}$ | 1.5 | ◎++ | Δ |
| 65 | Cu—20% Ag—5% Sn | 500 | 500 | $2 \times 10^{-5}$ | 1.4 | ◎++ | ◎ |
| 66 | Cu—0.03% Ag | 500 | 500 | $8 \times 10^{-6}$ | 1.5 | ◎ | ◎ |
| 67 | Cu—0.005% Sn | 500 | 500 | $8 \times 10^{-6}$ | 1.4 | ◎ | ◎ |
| 68 | Cu—60% Ag | 500 | 500 | $2 \times 10^{-6}$ | 1.6 | ◎ + | ◎ |
| 69 | Cu—15% Sn | 500 | 500 | $1 \times 10^{-4}$ | 1.3 | ◎ | x |

(Note) + indicates better and ++ indicates best of the excellent category.

What is claimed is:

1. A low-temperature burnt conductive paste comprising an organic vehicle having dispersed therein a composition comprising 50 to 95% by weight of a powder of at least one conductive material selected from the group consisting of a copper alloy, a copper oxide and a copper alloy oxide and 5 to 50% by weight of a glass powder having a softening point of 300° to 600° C. and a coefficient of thermal expansion of 6 to $13 \times 10^{-6}$° C.$^{-1}$, said copper alloy being selected from the group consisting of Cu-Ag, Cu-Sn and Cu-Ag-Sn, said Ag-containing alloys having a Ag content of from 0.05 to 50% by weight and, said Sn-containing alloys having a Sn content of from 0.01 to 10% by weight, and each of said copper oxide and copper alloy oxide having an oxidation ratio of 0.1 to 100%.

2. The paste according to claim 1, wherein the average particle size of said conductive material powder is not more than 10μ.

3. The paste according to claim 1, wherein said conductive material is flattened to have a flattening ratio (a ratio of length/thickness) of at least 1.5.

4. The paste according to claim 1, wherein said glass powder having the softening point of 300° to 600° C. and the coefficient of thermal expansion of 6 to 13 $\times 10^{-6}$° C.$^{-1}$ is a lead-silicate glass containing PbO-B$_2$O$_3$-SiO$_2$ as a major component.

5. The paste according to claim 2, wherein said conductive material is flattened to have a flattening ratio (a ratio of length/thickness) of at least 1.5.

6. The paste according to claim 5, wherein said glass powder having the softening point of 300° to 600° C. and the coefficient of thermal expansion of 6 to $13 \times 10^{-6}$° C.$^{-1}$ is a lead-borosilicate glass containing PbO-B$_2$O$_3$-SiO$_2$ as a major component.

7. The paste according to claim 2, wherein said glass powder having the softening point of 300° to 600° C. and the coefficient of thermal expansion of 6 to $13 \times 10^{-6}$° C.$^{-1}$ is a lead-borosilicate glass containing PbO-B$_2$O$_3$-SiO$_2$ as a major component.

8. The paste according to claim 7, wherein said conductive material is one of said copper alloys.

9. The paste according to claim 7, wherein said conductive material is one of said copper oxide.

10. The paste according to claim 7, wherein said conductive material is one of said copper alloy oxide.

11. The paste according to claim 1, wherein said conductive material is one of said copper alloy.

12. The paste according to claim 1, wherein said conductive material is one of said copper oxide.

13. The paste according to claim 1, wherein said conductive material is one of said copper alloy oxide.

* * * * *